(12) United States Patent
New

(10) Patent No.: US 8,399,983 B1
(45) Date of Patent: Mar. 19, 2013

(54) SEMICONDUCTOR ASSEMBLY WITH INTEGRATED CIRCUIT AND COMPANION DEVICE

(75) Inventor: Bernard J. New, Carmel Valley, CA (US)

(73) Assignee: Xilinx, Inc., San Jose, CA (US)

( * ) Notice: Subject to any disclaimer, the term of this patent is extended or adjusted under 35 U.S.C. 154(b) by 559 days.

(21) Appl. No.: 12/332,505

(22) Filed: Dec. 11, 2008

(51) Int. Cl.
*H01L 23/04* (2006.01)

(52) U.S. Cl. ........ 257/698; 257/686; 257/692; 257/774; 257/778

(58) Field of Classification Search .............. 361/760, 361/790; 257/777, 686, 685, 773, 774, 692, 257/698, 778
See application file for complete search history.

(56) References Cited

U.S. PATENT DOCUMENTS

| | | | |
|---|---|---|---|
| 5,309,324 A * | 5/1994 | Herandez et al. | 361/734 |
| 5,477,082 A * | 12/1995 | Buckley et al. | 257/679 |
| 5,611,696 A * | 3/1997 | Donner et al. | 439/66 |
| 5,642,262 A * | 6/1997 | Terrill et al. | 361/783 |
| 5,982,633 A * | 11/1999 | Jeansonne | 361/782 |
| 6,027,345 A * | 2/2000 | McHugh et al. | 439/66 |
| 6,137,164 A * | 10/2000 | Yew et al. | 257/686 |
| 6,243,272 B1 * | 6/2001 | Zeng et al. | 361/760 |
| 6,281,042 B1 * | 8/2001 | Ahn et al. | 438/108 |
| 6,376,917 B1 * | 4/2002 | Takeshita et al. | 257/778 |
| 6,434,016 B2 * | 8/2002 | Zeng et al. | 361/760 |
| 6,756,663 B2 * | 6/2004 | Shiraishi et al. | 257/686 |
| 6,765,152 B2 * | 7/2004 | Giri et al. | 174/260 |
| 6,821,802 B2 * | 11/2004 | Ahn et al. | 438/27 |
| 7,034,387 B2 * | 4/2006 | Karnezos | 257/686 |
| 7,081,650 B2 * | 7/2006 | Palanduz et al. | 257/310 |
| 7,122,904 B2 * | 10/2006 | Tsai et al. | 257/778 |
| 7,161,821 B2 * | 1/2007 | Martin et al. | 365/63 |
| 7,176,506 B2 * | 2/2007 | Beroz et al. | 257/232 |
| 7,233,061 B1 * | 6/2007 | Conn | 257/686 |
| 7,247,932 B1 * | 7/2007 | Lin et al. | 257/686 |
| 7,247,945 B2 * | 7/2007 | Sawada | 257/738 |
| 7,368,821 B2 * | 5/2008 | Kim et al. | 257/738 |
| 7,795,721 B2 * | 9/2010 | Kurita | 257/698 |
| 7,928,550 B2 * | 4/2011 | Wachtler | 257/686 |
| 2002/0030261 A1 * | 3/2002 | Rolda et al. | 257/685 |

* cited by examiner

*Primary Examiner* — Bac Au
(74) *Attorney, Agent, or Firm* — Robert M. Brush; Kin-Wah Tong; LeRoy D. Maunu

(57) ABSTRACT

A semiconductor assembly with an integrated circuit (IC) and a companion device. An exemplary semiconductor assembly includes a printed circuit board (PCB) and first and second ICs. The PCB has first contacts on a top surface and second contacts on a bottom surface. The first contacts are vertically aligned with the second contacts and are electrically coupled by vias in the PCB. The first IC has first terminals respectively coupled to the first contacts of the PCB, the first terminals including first input/output (IO) terminals. The second IC includes at least one die, and second terminals coupled to at least a portion of the second contacts of the PCB. The second terminals include second IO terminals of the companion die, and are respectively coupled to those of the second contacts that are vertically aligned with those of the first contacts respectively coupled to the first IO terminals.

19 Claims, 3 Drawing Sheets

SEMICONDUCTOR ASSEMBLY WITH INTEGRATED CIRCUIT AND COMPANION DEVICE

FIELD OF THE INVENTION

One or more aspects of the present invention relate generally to integrated circuit assemblies and, more particularly, to a semiconductor assembly with an integrated circuit and a companion device.

BACKGROUND

An integrated circuit (IC) that implements a logic device is frequently required to communicate with one or more companion devices implemented in another IC. Exemplary logic ICs include programmable ICs such as field programmable gate arrays (FPGAs) or other types of programmable logic devices (PLDs), application specific integrated circuits (ASICs), mask-programmable devices, non-programmable devices, and partially programmable devices. A logic IC can be mounted on a circuit board along with the companion IC. The logic IC may be coupled to the companion IC through traces on the circuit board. In a printed circuit board (PCB), for example, traces are conductive pathways etched from conductive sheets laminated within a non-conductive substrate.

With present high-speed companion devices, ideally, circuit board traces between a logic IC and a companion IC should be kept short to achieve correct communication. In addition, ideally, the many traces between a logic IC and a companion IC should be of equal length so that signal delays over the traces are equal to one another. However, trace length may have various other constraints, such as routing constraints and the like, which can cause traces to be unequal enough in length to deleteriously affect communication between a logic IC and a companion IC.

Accordingly, there exists a need in the art for an IC coupled to a companion device that overcomes the aforementioned disadvantages.

SUMMARY

An aspect of the invention relates to a semiconductor assembly. In some embodiments, the semiconductor assembly includes a printed circuit board (PCB) and first and second integrated circuits (ICs). The PCB has first contacts on a top surface and second contacts on a bottom surface. The first contacts are vertically aligned with the second contacts and are electrically coupled by vias in the PCB. The first IC has first terminals respectively coupled to the first contacts of the PCB, the first terminals including first input/output (IO) terminals. The second IC includes at least one companion die, and second terminals coupled to at least a portion of the second contacts of the PCB. The second terminals include second IO terminals of the companion die, and are respectively coupled to those of the second contacts that are vertically aligned with those of the first contacts respectively coupled to the first IO terminals.

According to another aspect of the invention, a semiconductor assembly includes first and second ICs and a PCB. The first IC has a logic device die with a communication interface and first terminals, a plurality of the first terminals being coupled to the communication interface. The second IC has at least one companion device die and second terminals, a plurality of the second terminals providing an input/output (IO) interface to the at least one companion device. At least one terminal of the second terminals is isolated from the at least one companion device. The PCB has a top surface with first contacts respectively coupled to the first terminals, and a bottom surface with second contacts respectively coupled to the second terminals, the first contacts being vertically aligned with the second contacts such that the plurality of the first terminals are vertically aligned with the plurality of the second terminals. The PCB also includes vias disposed therein. The vias are configured to electrically couple the first contacts and the second contacts.

According to yet another aspect of the invention, a semiconductor assembly includes first and second ICs and a PCB. The first IC has a programmable logic device die with input/output (IO) logic blocks and first terminals, a plurality of the first terminals being coupled to the IO logic blocks. The second IC has at least one companion device die and second terminals, a plurality of the second terminals providing an IO interface to the at least one companion device. At least one terminal of the second terminals is isolated from the at least one companion device. The printed circuit board (PCB) has a top surface with first contacts respectively coupled to the first terminals, and a bottom surface with second contacts respectively coupled to the second terminals. The first contacts are vertically aligned with the second contacts such that the plurality of the first terminals are vertically aligned with the plurality of the second terminals. The PCB includes vias disposed therein, the vias being configured to electrically couple the first contacts and the second contacts.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

DETAILED DESCRIPTION OF THE DRAWINGS

Figure 1:
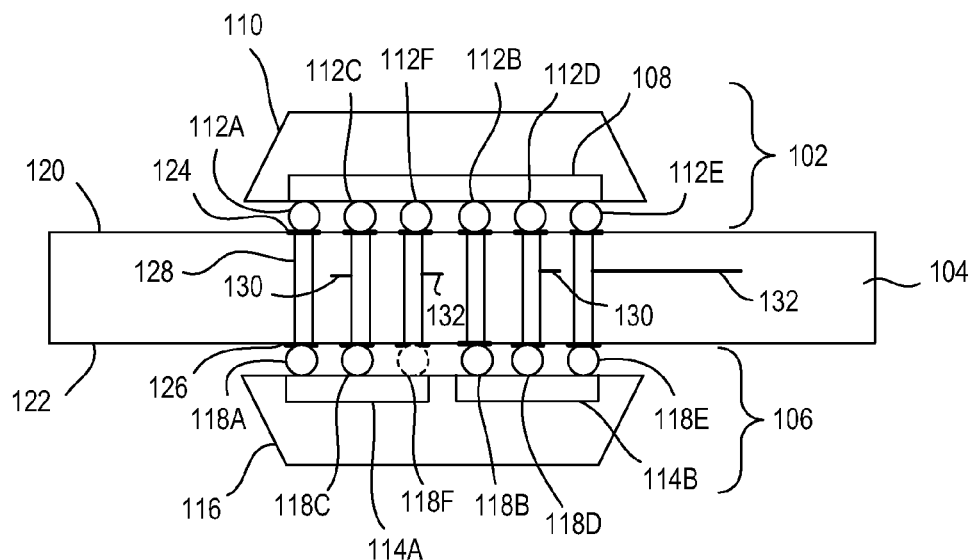
FIG. 1 illustrates a first semiconductor assembly according to some embodiments of the invention.

FIG. 1 illustrates a semiconductor assembly 100 according to some embodiments of the invention. Semiconductor assembly 100 includes an integrated circuit (IC) 102, a printed circuit board (PCB) 104, and an IC 106. IC 102 includes a die 108 and a package 110 having a plurality of terminals 112A-112F. Six terminals are shown, for clarity, but more than six terminals are typically included. Die 108 may implement any type of logic device, such as an application specific integrated circuit (ASIC), a standard product (e.g., a microprocessor), an application specific standard product (ASSP), a programmable logic device (PLD), a field programmable gate array (FPGA), or the like. Although a single die 108 is shown, those skilled in the art will appreciate that the logic IC 102 may include multiple dice 108. Terminals 112A-112F are illustratively shown as solder balls. For example, package 110 may be a ball grid array (BGA) or like type integrated circuit package. However, those skilled in the art will appreciate that other types of packaging may be used, such as a land grid array (LGA) package, in which case terminals 112A-112F are lands. IC 102 may be referred to herein as the "logic IC" or "first IC".

IC 106 includes at least one companion die 114 (e.g., two die 114A and 114B are shown by example), a package 116, and a plurality of terminals 118A-118F. Six terminals are shown, for clarity, but more than six terminals are typically included. Die 114 may implement any type of memory device, for example, including volatile memories, such as random access memory (RAM), double data rate (DDR) RAM, and the like, as well as non-volatile memories, such as various read only memories (ROM), FLASH memory, or the like. Die 114 may also implement other types of companion devices, such as a functional accelerator or communication device, for example. Terminals 118A-118F are illustratively shown as solder balls. For example, package 116 may be a BGA or like type integrated circuit package. However, those skilled in the art will appreciate that other types of packaging may be used, such as an LGA package, in which case terminals 118A-118F are lands. IC 106 may be referred to herein as the "companion IC" or "second IC".

With respect to logic IC 102, some of terminals 112A-112F may be input/output (IO) terminals configured to send and/or receive signals. For example, terminals 112A-112F may include IO terminals 112A and 112B. The IO terminals of IC 102 may be coupled to IO logic implemented on die 108 (an example is shown below for an FPGA). Others of terminals 112A-112F may be power or ground terminals configured to receive a power supply or electrical ground (generally referred to as power terminals). For example, terminals 112A-112F may include power terminals 112D and 112C.

With respect to second IC 106, terminals 118A-118F provide an electrical interface to the companion device(s) on die 114. An electrical interface of a companion device includes signals (e.g., data, address, control) and power/grounds. Accordingly, some of terminals 118A-118F may be IO terminals configured to send and/or receive signals. For example, terminals 118A-118F may include IO terminals 118A and 118B. Others of terminals 118A-118F may be power terminals configured to receive a power supply or electrical ground. For example, terminals 118A-118F may include power terminals 118D and 118C. Note that while only one power terminal is illustrated for each die 114A and 114B, for clarity, a larger number of power terminals are typically provided.

PCB 104 includes a top surface 120 and a bottom surface 122. The terms "top" and "bottom" are relative and being used by way of example. Therefore, the "top" and "bottom" surfaces may be reversed in some embodiments. The top surface 120 includes contacts 124. Contacts 124 are illustratively shown as lands for mating with solder balls. Those skilled in the art will appreciate that contacts 124 may be configured differently to match terminals 112A-112F of the logic IC 102 (e.g., pins for an LGA package). Contacts 124 are disposed on the top surface 120 in a spatial configuration matching a spatial configuration of terminals 112A-112F on logic IC 102 (e.g., a two-dimensional grid having a particular pitch between terminals/contacts). Logic IC 102 may be electrically and mechanically coupled to the top surface 120 by respectively coupling terminals 112A-112F to contacts 124 in a well known manner.

The bottom surface 122 includes contacts 126. Contacts 126 are illustratively shown as lands for mating with solder balls. Those skilled in the art will appreciate that contacts 126 may be configured differently to match terminals 118A-118F of the companion IC 106 (e.g., pins for an LGA package). Contacts 126 are disposed on the bottom surface 122 in a spatial configuration matching the spatial configuration of contacts 124. In turn, companion IC 106 may be electrically and mechanically coupled to the bottom surface 122 by coupling terminals 118A-118F to contacts 126.

With respect to PCB 104, contacts 124 on the top surface 120 are vertically aligned with contacts 126 on the bottom surface 122. PCB 104 includes vias 128 that extend between and electrically couple contacts 124 and contacts 126, i.e., each via electrically couples together a contact pair 124/126. Accordingly, terminals 112A-112F of logic IC 102 are vertically aligned with contacts 126 on the bottom surface 122, and hence with terminals 118A-118F of companion IC 106. Vias 128 may be formed having substantially the same length from via-to-via. That is, the length of the vias is dictated by the thickness of PCB 104, which provides for consistency in via length. Thus, connections between logic IC 102 and companion IC 106 are minimal in length (i.e., the thickness of the PCB) and consistent in length as compared to using traces on the PCB, which can result in longer connections being inconsistent in length. Thus, the use of vias 128 improves communication between logic IC 102 and companion IC 106 compared to the use of traces.

Notably, the IO terminals 112A and 112B of logic IC 102 are vertically aligned with the IO terminals 118A and 118B, respectively, of companion IC 106 and coupled thereto by corresponding vias 128. Thus, the shorter and more consistent length vias 128 can provide for improved communication of potentially high-speed IO signals between logic IC 102 and companion IC 106 as compared to the use of traces the PCB 104. In the embodiment shown, power terminals 112C and 112D of logic IC 102 are vertically aligned with power terminals 118C and 118D, respectively, of companion IC 106, and coupled thereto by corresponding vias 128. Notably, those vias 128 that provide power/ground to the power terminals of the logic IC 102 (e.g., terminals 112C and 112D) are coupled to traces 130 that provide the power and/or ground. Companion IC 106 can be configured to share power/ground with the logic IC 102, as shown in FIG. 1.

Figure 2:
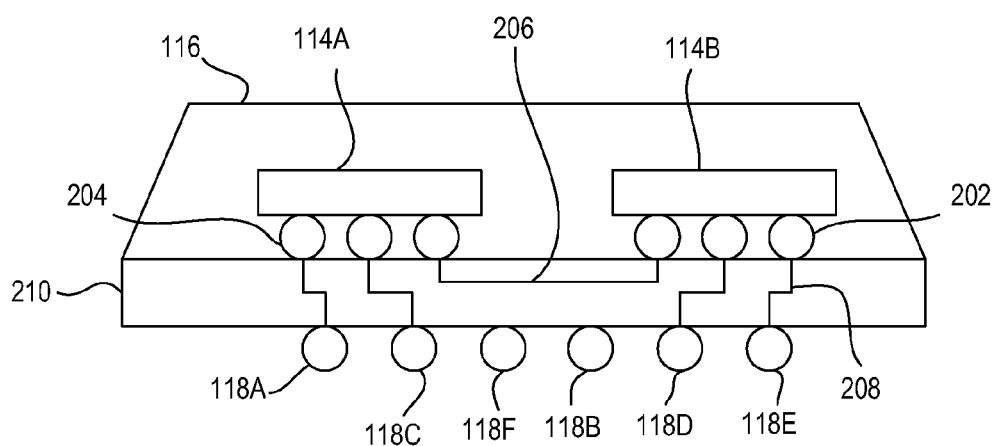
FIG. 2 is a more detailed illustration of a companion IC according to some embodiments of the invention.

FIG. 2 is a more detailed illustration of companion IC 106 according to some embodiments of the invention. Dice 114A and 114B are mounted to a top surface of a carrier substrate 210. A bottom surface of carrier substrate 210 includes terminals 118A-118F of companion IC 106. As shown, the die 114A is mounted to the carrier substrate 210 in flip-chip fashion by a plurality of bump contacts 202, and the die 114B is mounted to the carrier substrate 210 in flip-chip fashion by a plurality of bump contacts 204. Those skilled in the art will appreciate that die 114A and die 114B can be mounted to the carrier substrate 210 using various other techniques known in the art, such as wire bonding or TAB bonding.

As shown, some of the bump contacts 202 and 204 are coupled to some of the terminals 118 using conductive interconnect 208 in the carrier substrate 210. For example, die 114B is coupled to power terminal 118D and IO terminal 118E, and die 114A is coupled to power terminal 118C and IO terminal 118A. In some embodiments, some of the terminals 118 are not coupled to die 114 of companion IC 106. For example, terminals 118 may include non-connected terminals 118B and 118F.

In particular, in some embodiments some of terminals 112A-112F of logic IC 102 are not part of the IO interface with companion IC 106, and are not otherwise shared with companion IC 106. These terminals are generally referred to as non-shared terminals. Exemplary non-shared terminals 112 may include terminals 112B and 112F. The non-shared ones of terminals 112A-112F may include signal terminals and/or power/ground terminals. Nevertheless, such non-shared ones of terminals 112A-112F may be vertically aligned with and coupled to corresponding ones of terminals 118A-118F of companion IC 106. This approach simplifies the manufacturing of PCB 104, and also allows PCB 104 to accommodate logic ICs and companion ICs having different IO/power configurations. Rather than specifically configuring PCB 104, companion IC 106 can be configured such that the non-shared terminals 112B and 112F of logic IC 102 are not electrically coupled to die 114 in companion IC 106. That is, the specific terminals 118B and 118F on companion IC 106 are non-connected terminals.

In some embodiments, one of the dice 114A/114B can be coupled to one or more others of the dice 114A/114B through the carrier substrate 210. For example, die 114A is shown coupled to die 114B through conductive interconnect 206 in the carrier substrate 210. Thus, dice 114A/114B can be coupled to each other and to logic IC 102 through carrier substrate 210. In other embodiments, connections between the dice 114A/114B in companion IC 106 can be omitted, such that dice 114A/114B only communicate with logic IC 102.

Returning to FIG. 1, non-shared ones of terminals 112A-112F may be coupled to traces on PCB 104. For example, non-shared terminal 112F is shown coupled to trace 132. Note that in some embodiments, logic IC 102 may be configured such that all of terminals 112A-112F are shared with or communicate with companion IC 106.

In some embodiments, companion IC 106 may be isolated from those contacts 126 that are coupled to non-shared ones of the terminals 112A-112F. For example, terminal 118F (shown by a dashed line in FIG. 1) can be omitted from the terminals 118A-118F such that companion IC 106 is not coupled to the one of the contacts 126 that is vertically aligned with the terminal 112F. For example, non-shared terminal 112F may be coupled to logic on the die 108 that is particularly sensitive to extraneous loads, such as a non-connected one of the terminals 118A-118F (e.g., a multi-gigabit transceiver). By omitting terminal 118F, the extraneous load on non-shared terminal 112F is reduced. However, in general, terminals 118A-118E of companion IC 106 are coupled to corresponding one of the contacts 126.

Figure 3:
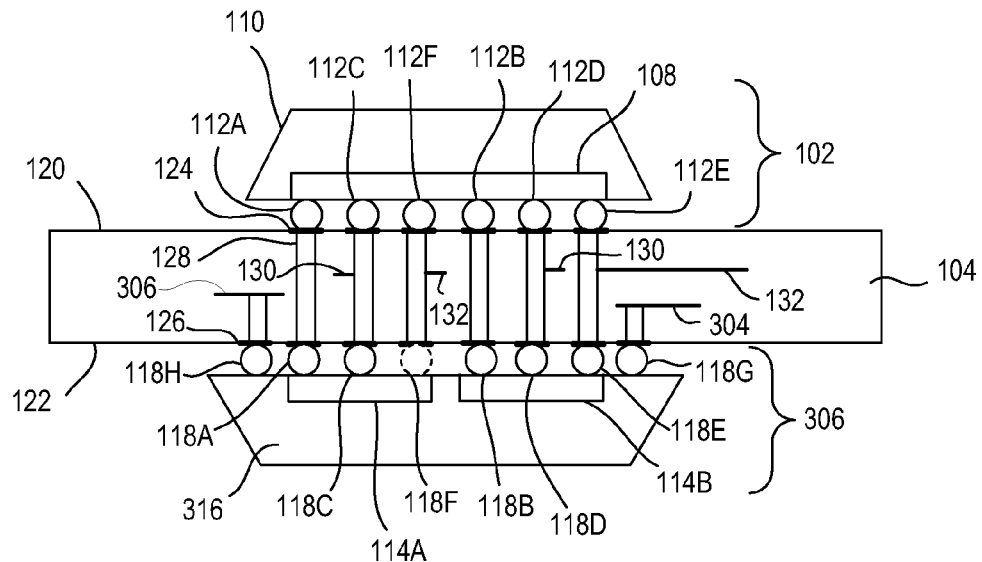
FIG. 3 illustrates a second semiconductor assembly according to some embodiments of the invention.

FIG. 3 illustrates a semiconductor assembly 300 according to some embodiments of the invention. Semiconductor assembly 300 is similar to semiconductor assembly 100 of FIG. 1, and similar components have been designated with identical reference numerals. In semiconductor assembly 300, companion IC 106 is replaced with a companion IC 306. Companion IC 306 may be configured similarly to the configuration of companion IC 106 shown in FIGS. 1 and 2, with the exception of including one or more additional terminals 118G and 118H that are not vertically aligned with corresponding terminals 112 on the logic IC 102. Terminals 118G and 118H are referred to herein as non-aligned terminals. To accommodate the additional non-aligned terminals, the package 316 may be enlarged as compared to that of companion IC 106 in FIG. 1. Accordingly, companion IC 306 may be larger in extent than logic IC 102, such that the non-aligned terminals are not aligned with any of the terminals 112 on logic IC 102. Non-aligned terminals 118G and 118H may be coupled to conductive interconnect on PCB 104, such as signal traces, power traces, or ground traces. In FIG. 3, non-aligned terminal 118G is coupled to conductive interconnect 304, and non-aligned terminal 118H is coupled to conductive interconnect 306. The non-aligned terminals 118 may be used to provide, for example, different power supplies than are provided to logic IC 102, or IO signals to/from components on PCB 104 other than logic IC 102.

Figure 4:
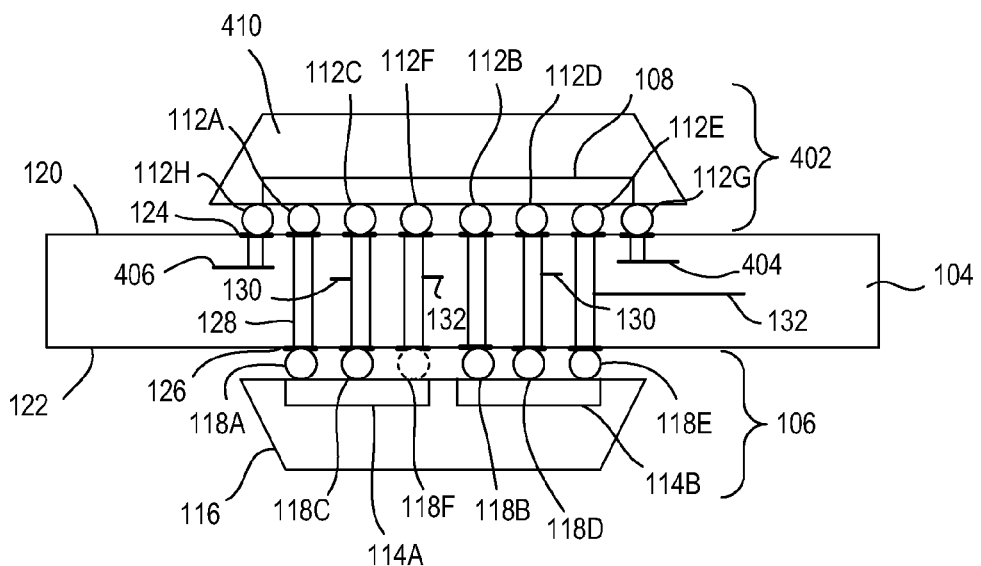
FIG. 4 illustrates a third semiconductor assembly according to some embodiments of the invention.

FIG. 4 illustrates a semiconductor assembly 400 according to some embodiments of the invention. Semiconductor assembly 400 is similar to semiconductor assembly 100 of FIG. 1, and similar components have been designated with identical reference numerals. In semiconductor assembly 400, logic IC 102 is replaced with a logic IC 406 that includes one or more additional terminals 112G and 112H that are not vertically aligned with corresponding terminals 118 on companion IC 106 (non-aligned terminals). To accommodate the additional non-aligned terminals 112G and 112H, the package 410 may be enlarged as compared to that of logic IC 102 in FIG. 1. Accordingly, logic IC 402 may be larger in extent than companion IC 106, such that the non-aligned terminals are not aligned with any of the terminals 118 on the companion IC 106. Non-aligned terminals 112G and 112H may be coupled to conductive interconnect on PCB 104, such as signal traces, power traces, or ground traces. In FIG. 4, non-aligned terminal 112G is coupled to conductive interconnect 404, and non-aligned terminal 112H is coupled to conductive interconnect 406. The non-aligned terminals 112 may be used to provide, for example, signals, power supplies, or ground that are not shared with companion IC 106.

In some embodiments, a semiconductor assembly may include both logic IC 402 of FIG. 4 and companion IC 306 of FIG. 3. In such embodiments, only a portion of terminals 112 and terminals 118 are vertically aligned and coupled. Other terminals 112 and other terminals 118 are not vertically aligned and are coupled to conductive interconnect on PCB 104.

Figure 5:
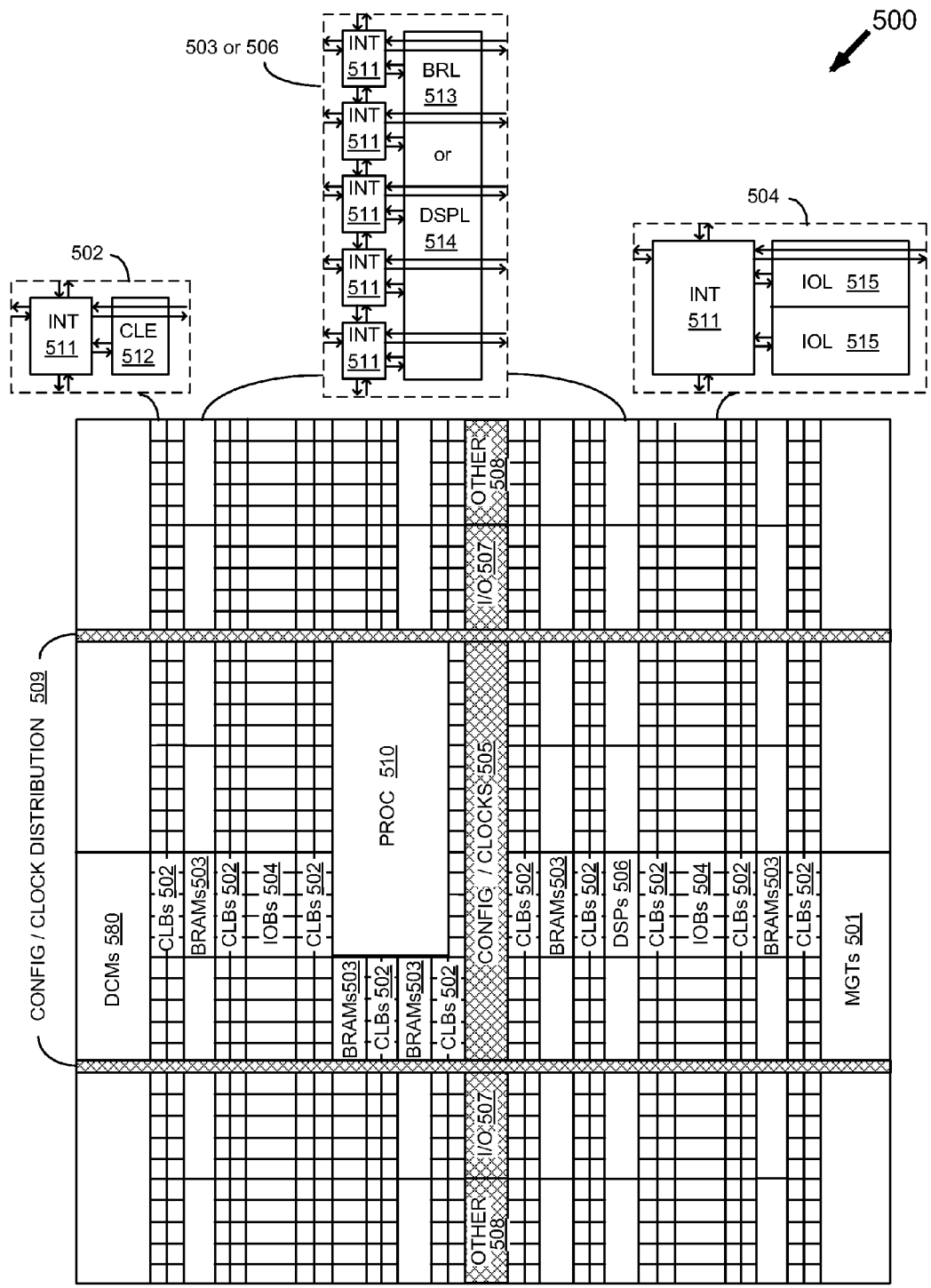
FIG. 5 illustrates an FPGA architecture according to some embodiments of the invention.

FIG. 5 illustrates a field programmable gate array (FGPA) architecture 500 that can be used, for example, as die 108 in the embodiments of FIGS. 1, 3, and 4. FPGA architecture 500 includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. A given set of programmable tiles of an FPGA is referred to herein as a programmable fabric of the FPGA.

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515.

The FPGA architecture 500 also includes one or more dedicated processor blocks (PROC 510). The processor block 510 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICRO-BLAZE soft microprocessor, available from Xilinx of San Jose, Calif., may be employed. A hard microprocessor may be implemented using an IBM POWER PC, Intel PENTIUM, AMD ATHLON, or like type processor core known in the art. The processor block 510 is coupled to the programmable logic of the FPGA in a well known manner.

In the pictured embodiment, a columnar area near the center of the die is used for configuration, clock, and other control logic. Horizontal areas 509 extending from this column are used to distribute the clocks and configuration signals across the breadth of the FPGA. In other embodiments, the configuration logic may be located in different areas of the FPGA die, such as in the corners of the FPGA die. Configuration information for the programmable logic is stored in configuration memory. The configuration logic 505 provides an interface to, and loads configuration data to, the configuration memory. A stream of configuration data ("configuration bitstream") may be coupled to the configuration logic 505, which in turn loads the configuration memory.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations as well as the location of the blocks within the array included at the top of FIG. 5 are purely exemplary. For example, in an actual FPGA more than one adjacent column of CLBs is typically included wherever the CLBs appear, to facilitate the efficient implementation of user logic, but the number of CLB columns varies by the size of the device.

IOBs 504 may be used to implement IO logic coupled to IO terminals of logic IC 102 or 402 (e.g., terminals 112A and 112B). The IO logic may provide a communication interface for other logic. IOBs 504 can be programmable such that the IOBs can be configured with an IO standard matching the electrical interface of the companion device (e.g., companion IC 106 or 306).

An assembly with an integrated circuit and a companion device has been described. In some embodiments, a first IC (e.g., logic IC 102 or 402) includes first terminals respectively coupled to first contacts on a top surface of a PCB, where some of the terminals are IO terminals that provide a communication interface for the first IC. The first contacts are vertically aligned with second contacts on a bottom surface of the PCB and coupled thereto by vias. A second IC (e.g., companion IC 106 or 306) includes second terminals coupled to at least a portion of the second contacts, where some of the second terminals are IO terminals of the second IC. For example, in some embodiments, as shown in FIG. 1, the first terminals of logic IC 102 include all of the terminals 112, where terminals 112A and 112B are IO terminals, and the second terminals of companion IC 106 include all of the terminals 118 that are present, where terminals 118A and 118B are IO terminals. Thus, in general, the IO terminals of the second terminals are respectively coupled to those of the second contacts that are vertically aligned with those of the first contacts respectively coupled to the IO terminals of the first terminals.

In some embodiments, the second terminals include non-connected terminals, and one or more companion dice in the second IC are not coupled to the non-connected terminals. For example, terminals 118E and 118F as shown in FIGS. 1 and 2 are not connected to companion die 114.

In some embodiments, the first terminals of the first IC include non-shared terminals, and the second IC is not coupled to those of the second contacts that are vertically aligned with those of the first contacts respectively coupled to the non-shared terminals. For example, in some embodiments, as shown in FIG. 1, terminals 112E and 112F are non-shared terminals and companion IC 106 can be isolated from these non-shared terminals by omitting a corresponding one of terminals 118 (terminal 118F).

In some embodiments, the PCB includes third contacts on the bottom surface and conductive interconnect coupled to the third contacts, and the second IC includes third terminals respectively coupled to the third contacts. For example, terminals 118G and 118H may be third terminals coupled to conductive interconnects 304 and 306.

In some embodiments, the PCB includes third contacts on the top surface and conductive interconnect coupled to the third contacts, and the first IC includes third terminals respectively coupled to the third contacts. For example, terminals 112G and 112H may be third terminals coupled to conductive interconnects 404 and 406.

In some embodiments, the PCB includes third contacts on the bottom surface and fourth contacts on the top surface of the PCB and conductive interconnect coupled to the third and fourth contacts. The second IC includes third terminals coupled to the third contacts, and the first IC includes fourth terminals coupled to the fourth contacts. For example, terminals 118G and 118H may be third terminals coupled to conductive interconnects 304 and 306, and terminals 112G and 112H may be fourth terminals coupled to conductive interconnects 404 and 406.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Trademarks are the property of their respective owners.

What is claimed is:

1. A semiconductor assembly, comprising:
a printed circuit board (PCB) having first contacts on a top surface and second contacts on a bottom surface, the first contacts being vertically aligned with the second contacts and being electrically coupled by vias in the PCB;
a first integrated circuit (IC) having first terminals respectively coupled to the first contacts of the PCB, the first terminals including first input/output (IO) terminals, a first power terminal, and a first ground terminal; and
a second integrated circuit (IC) having at least one companion die, and second terminals coupled to at least a portion of the second contacts of the PCB, the second terminals including second IO terminals of the at least one companion die, a second power terminal, and a second ground terminal, the second IO terminals being respectively coupled to those contacts of the second contacts that are vertically aligned with those contacts of the first contacts respectively coupled to the first IO terminals, the second power terminal being coupled to a contact of the second contacts that is vertically aligned with a contact of the first contacts respectively coupled to the first power terminal, and the second ground terminal being coupled to a contact of the second contacts that is vertically aligned with a contact of the first contacts respectively coupled to the first ground terminal, wherein:

the first terminals include at least one non-shared terminal; and the second terminals include at least one terminal that is vertically aligned with, and that is not coupled to a contact of the second contacts that is vertically aligned with the contact of the first contacts that is respectively coupled to the at least one non-shared terminal, wherein the at least one non-shared terminal is coupled to a die logic of the first IC that is sensitive to extraneous loads.

2. The semiconductor assembly of claim 1, wherein the vias are of substantially equal length.

3. The semiconductor assembly of claim 1, wherein at least one of the first terminals other than the first IO terminals, the first power terminal, and the first ground terminal is coupled to a trace on the PCB.

4. The semiconductor assembly of claim 1, wherein:
the second terminals include non-connected terminals; and
the at least one companion die is not coupled to the non-connected terminals.

5. The semiconductor assembly of claim 1, wherein:
the PCB includes third contacts on the bottom surface and a conductive interconnect coupled to the third contacts; and
the second IC includes third terminals respectively coupled to the third contacts.

6. The semiconductor assembly of claim 1, wherein:
the PCB includes third contacts on the top surface and a conductive interconnect coupled to the third contacts; and
the first IC includes third terminals respectively coupled to the third contacts.

7. The semiconductor assembly of claim 1, wherein:
the PCB includes third contacts on the bottom surface and a first conductive interconnect coupled to the third contacts, and fourth contacts on the top surface and a second conductive interconnect coupled to the fourth contacts;
the second IC includes third terminals respectively coupled to the third contacts; and
the first IC includes fourth terminals respectively coupled to the fourth contacts.

8. A semiconductor assembly, comprising:
a first integrated circuit (IC) having a logic device die with a communication interface and first terminals, a plurality of the first terminals coupled to the communication interface, a plurality of the first terminals providing an input/output (IO) interface to the first IC, at least one of the first terminals providing an interface to the first IC for a power signal, and at least one of the first terminals providing an interface to the first IC for a ground signal;
a second IC having at least one companion device die and second terminals, a plurality of the second terminals providing an IO interface to the at least one companion device die, at least one of the second terminals providing an interface to the second IC for the power signal, and at least one of the second terminals providing an interface to the second IC for the ground signal, at least one terminal of the second terminals being isolated from the at least one companion device die; and
a printed circuit board (PCB) having a top surface with first contacts respectively coupled to the first terminals, and a bottom surface with second contacts respectively coupled to the second terminals, the first contacts being vertically aligned with the second contacts such that the plurality of the first terminals are vertically aligned with the plurality of the second terminals, wherein the plurality of the first terminals providing the IO interface to the first integrated circuit are vertically aligned with the plurality of the second terminals providing the IO interface to the second IC, the at least one of the first terminals providing the interface to the first IC for the power signal is vertically aligned with the at least one of the second terminals providing the interface to the second IC for the power signal, and the at least one of the first terminals providing the interface to the first IC for the ground signal is vertically aligned with the at least one of the plurality of second terminals providing the interface to the second IC for the ground signal,
wherein the PCB includes vias disposed therein, the vias being configured to electrically couple the first contacts and the second contacts,
wherein:
the first terminals include at least one non-shared terminal; and
the second terminals include at least one terminal that is vertically aligned with, and that is not coupled to a contact of the second contacts that is vertically aligned with the contact of the first contacts that is respectively coupled to the at least one non-shared terminal, wherein the at least one non-shared terminal is coupled to a die logic of the logic device die that is sensitive to extraneous loads.

9. The semiconductor assembly of claim 8, wherein the vias are of substantially equal length.

10. The semiconductor assembly of claim 8, wherein:
the first terminals include at least one first surface-mount terminal vertically aligned with the at least one terminal of the second terminals that is isolated from the at least one companion device, respectively; and
the PCB includes at least one trace coupled to the at least one first-surface mount terminal.

11. The semiconductor assembly of claim 8, wherein:
the first IC includes third terminals;
the PCB includes third contacts disposed on the top surface and respectively coupled to the third terminals, fourth contacts disposed on the bottom surface vertically aligned with the third contacts, and vias electrically coupling the third contacts with the fourth contacts; and
the second IC is isolated from the fourth contacts.

12. The semiconductor assembly of claim 8, wherein:
the second IC includes at least one additional terminal that is part of the IO interface; and
the PCB includes at least one contact disposed on the bottom surface respectively coupled to the at least one additional terminal, and further includes at least one trace respectively coupled to the at least one contact.

13. The semiconductor assembly of claim 8, wherein:
the at least one companion device die includes a first companion device die and a second companion device die; and
the first companion device die is coupled to the second companion device die.

14. A semiconductor assembly, comprising:
a first integrated circuit (IC) having a programmable logic device die with input/output (IO) logic blocks and first terminals, a plurality of the first terminals coupled to the IO logic blocks, at least one of the first terminals providing an interface for a power signal to the first IC, and at least one of the first terminals providing an interface for a ground signal to the first IC;
a second IC having at least one companion device die and second terminals, a plurality of the second terminals providing an IO interface to the at least one companion device die, at least one of the second terminals providing an interface for the power signal to the second IC, at least one of the second terminals providing an interface for the ground signal to the second IC, and at least one terminal of the second terminals being isolated from the at least one companion device die; and
a printed circuit board (PCB) having a top surface with first contacts respectively coupled to the first terminals, and a bottom surface with second contacts respectively coupled to the second terminals, the first contacts being vertically aligned with the second contacts such that the plurality of the first terminals are vertically aligned with the plurality of the second terminals, wherein the plurality of the first terminals coupled to the IO logic blocks are vertically aligned with the plurality of the second terminals providing the IO interface to the at least one companion device, wherein the at least one of the first terminals providing the interface for the power signal to the first IC is vertically aligned with the at least one of the second terminals providing the interface for the power signal to the second IC, and the at least one of the first terminals providing the interface for the ground signal to the first IC is vertically aligned with the at least one of the second terminals providing the interface for the ground signal to the second IC,
wherein the PCB includes vias disposed therein, the vias being configured to electrically couple the first contacts and the second contacts,
wherein:
the first terminals include at least one non-shared terminal; and
the second terminals include at least one terminal that is vertically aligned with, and that is not coupled to a contact of the second contacts that is vertically aligned with the contact of the first contacts that is respectively coupled to the at least one non-shared terminal, wherein the at least one non-shared terminal is coupled to a die logic of the programmable logic device die that is sensitive to extraneous loads.

15. The semiconductor assembly of claim 14, wherein the IO logic blocks are configured to be programmed with an IO standard matching the IO interface of the at least one companion device.

16. The semiconductor assembly of claim 14, wherein the vias are of substantially equal length.

17. The semiconductor assembly of claim 14, wherein:
the first terminals include at least one terminal vertically aligned with the at least one terminal of the second terminals that is isolated from the at least one companion device, respectively; and
the PCB includes at least one trace coupled to the at least one terminal of the first terminals that is vertically aligned with the at least one terminal of the second terminals that is isolated from the at least one companion device.

18. The semiconductor assembly of claim 14, wherein:
the first IC includes third terminals;
the PCB includes third contacts disposed on the top surface and respectively coupled to the third terminals, fourth contacts disposed on the bottom surface vertically aligned with the third contacts, and vias electrically coupling the third contacts with the fourth contacts; and
the second IC is isolated from the fourth contacts.

19. The semiconductor assembly of claim 14, wherein:
the second IC includes at least one additional terminal that is part of the IO interface; and
the PCB includes at least one contact disposed on the bottom surface respectively coupled to the at least one additional terminal, and further includes at least one trace respectively coupled to the at least one contact.

* * * * *